United States Patent [19]

Fukuda et al.

[11] Patent Number: 4,689,580
[45] Date of Patent: Aug. 25, 1987

[54] ACTIVE FILTER CIRCUIT

[75] Inventors: Tokuya Fukuda; Shigeki Ishizuka; Noriyuki Yamashita, all of Tokyo, Japan

[73] Assignee: Sony Corporation, Tokyo, Japan

[21] Appl. No.: 844,983

[22] Filed: Mar. 27, 1986

[30] Foreign Application Priority Data

Mar. 29, 1985 [JP] Japan .................... 60-65872

[51] Int. Cl.⁴ .................... H03F 3/04; H03F 3/45
[52] U.S. Cl. .................... 330/306; 330/257
[58] Field of Search .............. 330/257, 302–306; 307/520; 358/38

[56] References Cited

U.S. PATENT DOCUMENTS 4,292,584 9/1981 Kusakabe ................ 330/257 X

Primary Examiner—James B. Mullins
Attorney, Agent, or Firm—Hill, Van Santen, Steadman & Simpson

[57] ABSTRACT

An active filter circuit having emitter coupled first and second transmittors and emitter coupled third and fourth transistors, wherein the base and collector electrodes of the third transistor are connected to the base electrode of the first transistor, and the base and collector electrodes of the fourth transistor are connected to the base electrode of the second transistor with a reactance circuit connected to a collector electrode of the second transistor and an output terminal connected by the collector electrode of the second transistor such that the filter circuit has a small number of components and operates over a broad band.

6 Claims, 6 Drawing Figures

ACTIVE FILTER CIRCUIT

BACKGROUND OF THE INVENTION

1. Field of the Invention

This invention relates generally to active filter circuits and more particularly to an active filter circuit which is suitable for use with a semiconductor integrated circuit and the like.

2. Description of the Prior Art

FIGS. 1 and 2 show active filter circuits which have been developed for use with a semiconductor integrated circuit which is used to process a television signal and a video signal.

FIG. 1 shows one example of a conventional low pass filter. In FIG. 1, one side of an input signal source 1 is connected to the base of an npn-type transistor 2 and the other side of the input signal source 1 is grounded. The collector of transistor 2 is connected to a voltage source terminal 3 to which a positive DC voltage is applied. The emitter of the transistor 2 is connected to the emitter of an npn-type transistor 4, and the connection point between the emitters of transistors 2 and 4 is grounded via a constant current circuit 5 through which a predetermined current I flows. The collector of the transistor 4 is connected to the voltage source terminal 3 via a constant current source circuit 6 and the collector of this transistor 4 is grounded via a capacitor 7 which has capacitance C which forms a load. The collector of the transistor 4 is further connected to the base of an npn-type transistor 8 which forms an emitter-follower-circuit of a feedback loop. The collector of the transistor 8 is connected to the voltage source terminal 3 and the emitter is grounded via a constant current circuit 9. The emitter of the transistor 8 is further connected to the base of the transistor 4 and an output terminal 10 is connected to the emitter of the transistor 8.

In principle, the active filter circuit shown in FIG. 1 forms a Gm (mutual conductance) feedback type primary filter circuit as shown in FIG. 3, and its filter characteristic H (ω) is given as $$H(\omega) = \frac{1}{1 + j\omega 2Cre}$$

where re is the emitter resistance $$\left(re = \frac{kT}{qI}\right)$$

of the transistors 2 and 4 and ω is the angular frequency.

The Gm feedback-type primary filter circuit shown in FIG. 3 will be described briefly. If the level of an input signal supplied to an input terminal 1a is L, the amplification factor of a differential amplifier circuit 2a is 1/r, the DC voltage supplied to a voltage source terminal 3a is H, the capacitance of a capacitor 7 is C and the output level generated at an output terminal 10 is X, then the following relations are established.

$$(L - X)\frac{1}{r} = j\omega C (X - H)$$

$$X = \frac{L + j\omega CrH}{1 + j\omega Cr}$$

FIG. 2 shows another example of the prior art primary low pass filter. The primary low pass filter of FIG. 2 employs a so-called Gilbert circuit.

Referring to FIG. 2, one side of the input signal source 1 is connected to the base of an npn-type transistor 11; and the other side is grounded. The emitter of the transistor 11 is grounded via a series circuit formed of a resistor 12 having a resistance value R and a constant current circuit 13 having a current I. The collector of the transistor 11 is connected to the emitter of an npn-type transistor 14 and the collector is connected to the voltage source terminal 3. The base of the transistor 14 is grounded via a battery 15. The collector of the transistor 11 is connected to the base of an npn-type transistor 16 and the collector is connected to the voltage source terminal 3 via a constant current circuit 17. The emitter of the transistor 16 is connected to the emitter of an npn-type transistor 18, and the connection point between the emitters of the transistors 16 and 18 is grounded via a constant current circuit 19 which has a constant current I. The collector of the transistor 18 is connected to the voltage source terminal 3. The base of the transistor 18 is connected to the collector of an npn-type transistor 20 and the emitter is connected through a resistor 21 having a resistance value R to the connection point between the resistor 12 and the constant current circuit 13. The collector of the transistor 20 is connected to the emitter of an npn-type transistor 22 and the collector is connected to the voltage source terminal 3. The base of the transistor 22 is connected to the base of the transistor 14. The collector of the transistor 16 is grounded via the capacitor 7 which has the capacitance C which forms a load. Also, the collector of the transistor 16 is connected to the base of an npn-type transistor 23 which forms an emitter-follower circuit of a feedback loop. The collector of the transistor 23 is connected to the voltage source terminal 3, and the emitter of the transistor 23 is grounded via a series circuit formed of a resistor 24 and a constant current circuit 25. The connection point between the resistor 24 and the constant current circuit 25 is connected to the base of the transistor 20 and an output terminal 10 is connected to the connection point between the resistor 24 and the constant current circuit 25.

In principle, the active filter circuit shown in FIG. 2 forms a Gm feedback type primary filter circuit such as shown in FIG. 3 and its filter characteristic H (ω) is given as $$H(\omega) = \frac{1}{1 + j\omega 2C(R + re)}$$

The number of circuit elements constituting the active filter circuit shown in FIG. 1 is small and the dynamic range of this active filter circuit is Ire and the emitter resistance re of the transistor is very small, therefore the dynamic range of this active filter circuit is very narrow.

On the other hand, since the dynamic range of the active filter circuit shown in FIG. 2 is I (R+re), if the respective resistance values R of the resistors 12 and 21 are increased, the dynamic range can be increased. However, since such active filter circuits as shown in FIG. 2 require many circuit elements, when such active filter circuit is used for LSI (large-scaled integration) circuits which use a number of active filter circuits, the number of the circuit elements becomes very large.

OBJECTS AND SUMMARY OF THE INVENTION

Accordingly, it is an object of the present invention to provide an active filter circuit with a dynamic range which is very large.

It is another object of the present invention to provide an active filter circuit in which the number of circuit elements used is less than in prior art devices.

It is a further object of the present invention to provide an active filter circuit which does not depend on the internal resistance of a semiconductor integrated circuit.

It is a still further object of the present invention to provide an active filter circuit which has good temperature characteristics when formed as a semiconductor integrated circuit.

It is a yet further object of the present invention to provide an active filter circuit which can provide a uniform filter characteristic and which has an excellent phase characteristic in the high frequency range.

According to one aspect of the present invention, there is provided an active filter circuit comprising: (a) emitter coupled first and second transistors; (b) emitter coupled third and fourth transistors, wherein the base and collector electrodes of the third transistor are connected to a base electrode of said first transistor, and the base and collector electrodes of the fourth transistor are connected to a base electrode of said transistor; (c) a reactance circuit connected to a collector electrode of said second transistor; and (d) an output terminal connected to said collector electrode of said second transistor.

These and other objects, features and advantages of the present invention will become apparent from the following detailed description of the preferred embodiments taken in conjunction with the accompanying drawings, throughout which like reference numerals designate like elements and parts.

DESCRIPTION OF THE PREFERRED EMBODIMENTS

Figure 1:
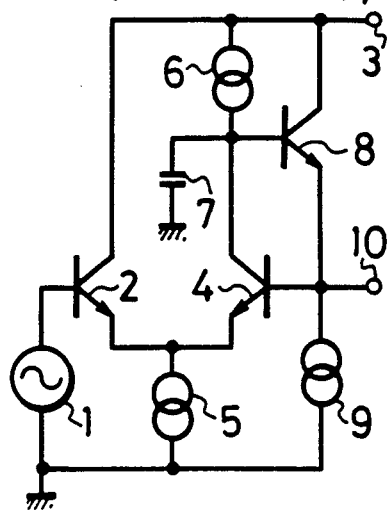
FIGS. 1 and 2 are circuit diagrams showing examples of prior art active filter circuits.
Figure 2:
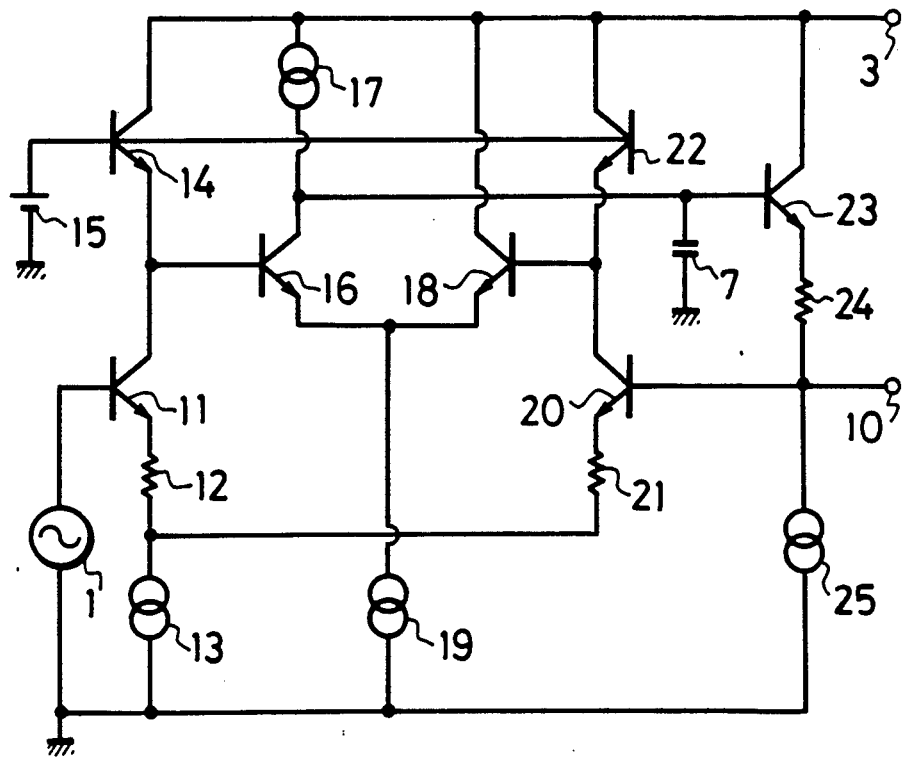
Figure 4:
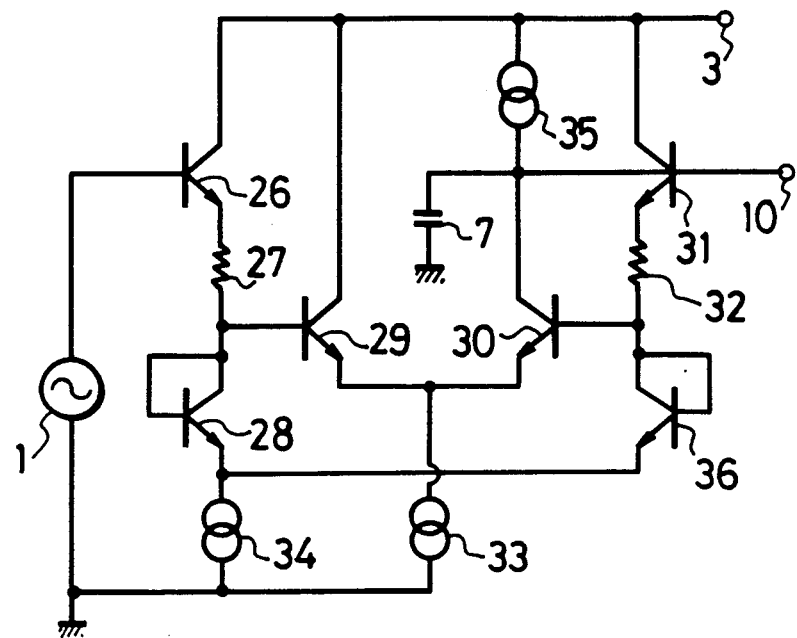
FIG. 4 is a circuit diagram showing an embodiment of an active filter circuit according to this invention.

An embodiment of an active filter circuit according to this invention will be described with reference to FIG. 4. In FIG. 4, like parts corresponding to those of FIGS. 1 and 2 are marked with the same references and their detailed description will be omitted.

According to the embodiment shown in FIG. 4, one side of the input signal source 1 is connected to the base of an npn-type transistor 26, and the other side of the signal source 1 is grounded. The collector of the transistor 26 is connected to the voltage source terminal 3, and the emitter of the transistor 26 is connected through a resistor 27 having a resistance value $R_1$ to the connection point between the base and collector of an npn-type transistor 28 which forms a diode, and the connection point is also connected to the base of an npn-type transistor 29. The transistors 28 and 29 constitute a differential amplifier circuit. The emitter of the transistor 28 is grounded via a constant current circuit 34 which has a constant current $I_1$. The collector of the transistor 29 is connected to the voltage source terminal 3 and the emitter of the transistor 29 is connected to the emitter of an npn-type transistor 30 which forms with the transistor 29 a differential amplifier circuit. The common connection point between the emitters of these transistors 29 and 30 is grounded via a constant current circuit 33 which has a constant current $I_2$. The collector of transistor 30 is connected to the voltage source terminal 3 via a constant current source 35, and the collector of transistor 30 is grounded via the capacitor 7 which forms a reactance circuit which is the load. The output terminal 10 is connected to the collector of the transistor 30 and to the base of an npn-type transistor 31. The collector of the transistor 31 is connected to the voltage source terminal 3 and the emitter of transistor 31 is connected through a resistor 32 having a resistance value $R_1$ to the connection point between the base and collector of an npn-type transistor 36 which forms a diode. The collector and base of transistor 36 is connected to the base of the transistor 30. The emitter of the transistor 36 is connected to the emitter of the transistor 28.

Figure 3:
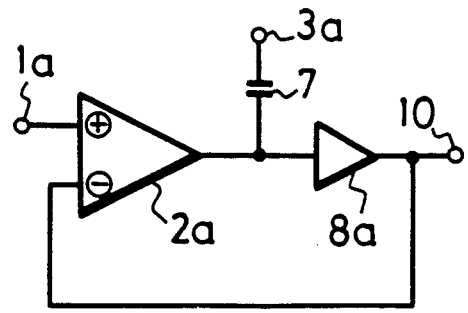
FIG. 3 is a diagram of a Gm (mutual conductance) feedback type primary filter circuit.

Also, the active filter circuit according to the present invention shown in FIG. 4 forms in principle, a Gm feedback type primary filter circuit as shown in FIG. 3. In FIG. 4, Vin=L, Vout=X and $$\frac{1}{r} = \frac{1}{2R_1 + 4re}$$

are satisfied. When $I_1 = I_2$, the filter characteristic $H(\omega)$ is given as $$H(\omega) = \frac{Vout}{Vin} = \frac{1}{1 + j\omega C(2R_1 + 4re)}$$

thus, the active filter circuit of this embodiment becomes a low pass filter circuit in which $$\omega c = 1/C(2R_1 + 4re)$$

is satisfied.

Also in the active filter circuit shown in FIG. 4, if the current $I_1$ is taken as a current which is determined by the internal resistance of the semiconductor integrated circuit and the current $I_2$ is taken as a current which is determined by a resistor externally connected thereto, the following relation is satisfied thus, the filter characteristic $H(\omega)$ becomes $$H(\omega) = \frac{1}{1 + j\omega C \frac{I_1(2R_1 + 4re)}{I_2}}$$

$$= 1 + j\omega C \frac{\frac{Vref}{R_1}(2R_1 + 4re)}{I_2}$$

Consequently, it is possible to realize an active filter circuit which does not depend on the internal resistance of the semiconductor integrated circuit. Accordingly, when the active filter circuit is formed into a semiconductor integrated circuit, it is possible to obtain an active filter circuit which has excellent temperature characteristics and which has a good filter characteristic.

The dynamic range of the active filter circuit according to this embodiment is determined by $I_2(2R_1+4re)$ so that this dynamic range can be wider than the prior art example of FIG. 2. Further, according to this embodiment, since the emitter-follower circuit is not required in the feedback circuit, it is possible to substantially reduce the number of circuit elements. For example, it is possible to reduce the number of circuit elements by 20% as compared with the example of FIG. 2. Therefore, it is very advantageous when this invention is used for a LSI which employs a large number of active filter circuit elements. Furthermore, since in the feedback circuit there is no emitter-follower circuit, the phase characteristic of the active flter circuit is not affected so that the active filter circuit of this embodiment has an excellent phase characteristic in the high frequency band.

Figure 5:
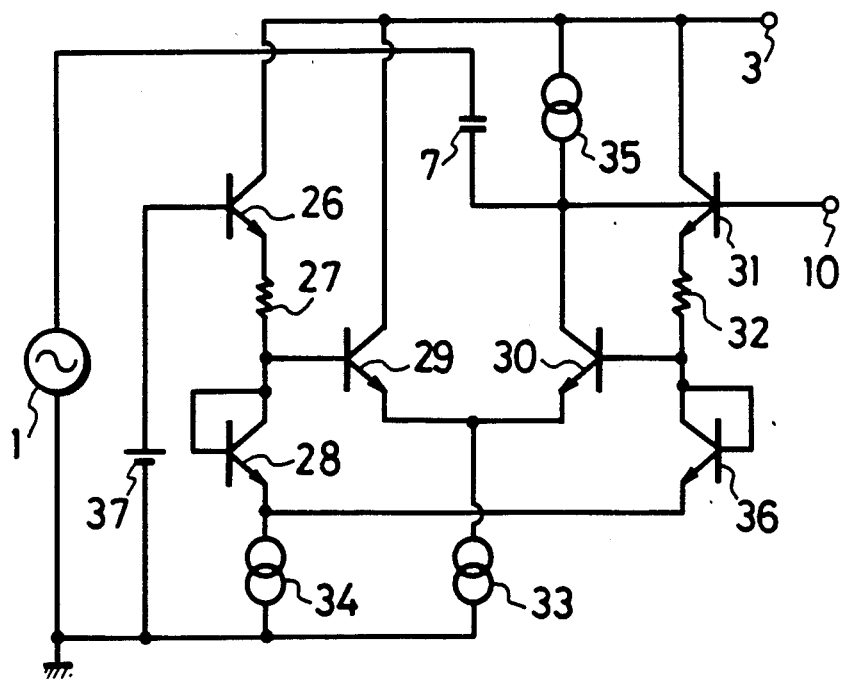
FIG. 5 is a circuit diagram showing other embodiment of the active filter circuit according to this invention, in which the present invention is applied to a high pass filter.

FIG. 5 shows other embodiment of the active filter circuit according to the present invention which is applied to a high pass filter circuit. In FIG. 5, like parts corresponding to those of FIG. 4 are marked with the same references and will not be described in detail.

According to the embodiment shown in FIG. 5, one side of the input signal source 1 is connected through the capacitor 7 which forms a reactance circuit to the collector of the transistor 30 and the other side of the signal source 1 is grounded. The base of the transistor 26 is grounded via a battery 37 which generates a predetermined DC voltage. The other circuit arrangements are the same as FIG. 4.

A principle of the embodiment of the active filter circuit shown in FIG. 5 is that it forms the Gm feedback type primary filter circuit shown in FIG. 3 and also forms a high pass filter circuit. It will easily be understood that the embodiment shown in FIG. 5 can achieve the same action and results as obtained with the circuit of FIG. 4.

Figure 6:
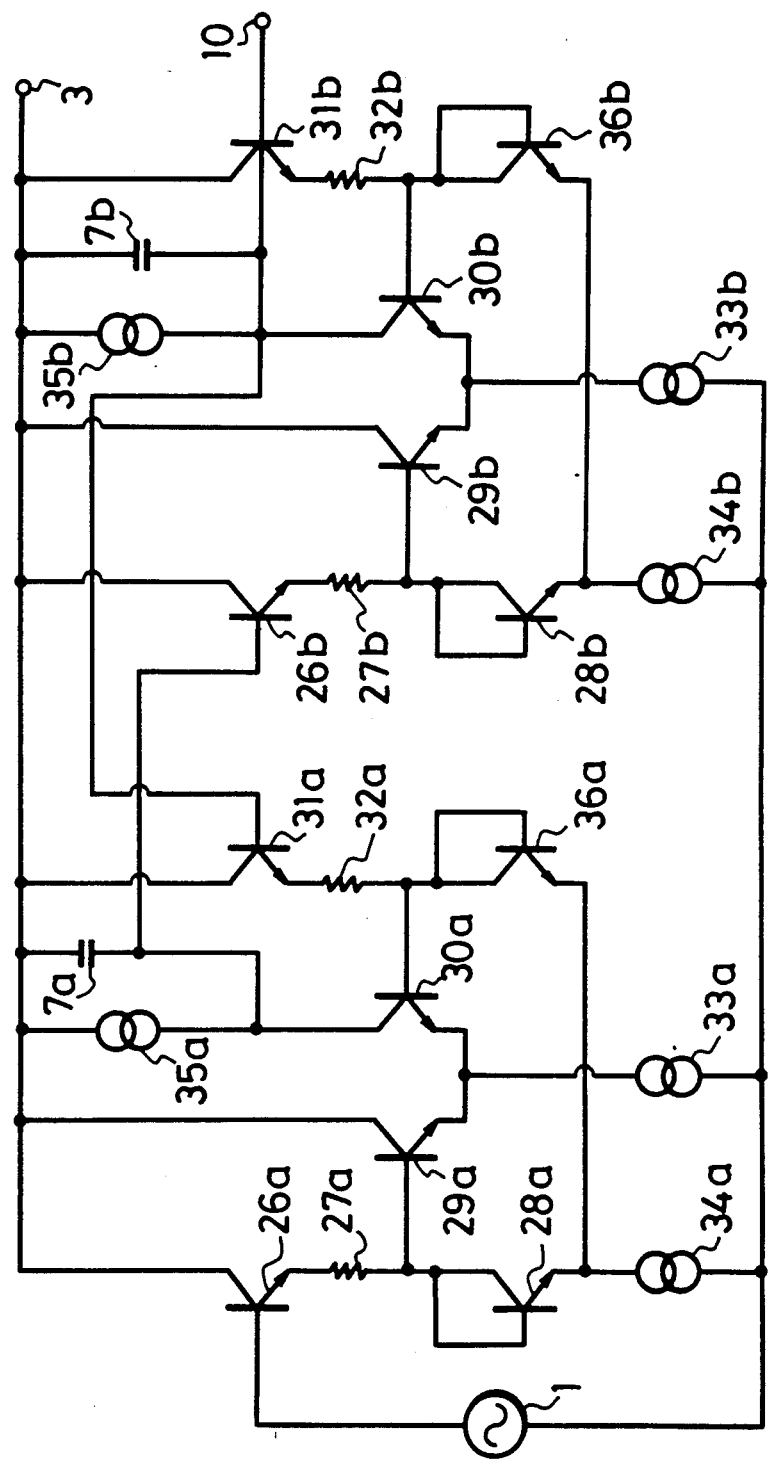
FIG. 6 is a circuit diagram showing a further embodiment of the active filter circuit according to this invention, in which the present invention is applied to a secondary low pass filter.

FIG. 6 shows other embodiment of the active filter circuit according to the present invention which is applied to a secondary low pass filter. In FIG. 6, like parts corresponding to those of FIG. 4 are marked with the same references suffixed with a and b. From FIG. 6, it will easily be understood that the active filter circuit according to this embodiment can achieve the same action and results as those obtained with the circuit of FIG. 4.

According to the present invention as described above, it is possible to obtain an active filter circuit which has a wide dynamic range and which reduces the number of circuit elements as compared to the prior art. This invention has many advantages particularly when applied to a LSI which employs a large number of active filter circuits.

Further, according to the present invention, it is possible to realize an active filter circuit which does not depend on the internal resistance of the semiconductor integrated circuit. Accordingly, when the active filter circuit of the invention is formed into a semiconductor integrated circuit, it is possible to obtain an active filter circuit which has excellent temperature characteristics and a desirable filter characteristic.

Furthermore, according to this invention as set forth above, since in the feedback circuit there is no emitter-follower circuit, it is possible to obtain an active filter circuit which has a good phase characteristic in the high frequency range and which also has a good frequency characteristic.

The above description is given for the preferred embodiments of the invention but it will be apparent that many modifications and variations could be effected by one skilled in the art without departing from the spirits or scope of the novel concepts of the invention so that the scope of the invention should be determined only by the appended claims.

We claim as our invention:

1. An active filter circuit comprising: emitter coupled first and second transistors; emitter coupled third and fourth transistors wherein the base and collector electrodes of the third transistor are connected to the base electrode of said first transistor, and the base and collector electrodes of said fourth transistor are connected to the base electrode of said second transistor; a reactance circuit connected to the collector electrode of said second transistor; and an output terminal connected to said collector electrode of said second transistor; and including first and second resistors and fifth and sixth transistors, wherein said base electrode of said first transistor is connected to a first reference potential through said first resistor and said fifth transistor, and said base electrode of said second transistor is connected to said first reference potential through said second resistor and said sixth transistor.

2. An active filter circuit according to claim 1, wherein an input signal is supplied to said collector electrode of said second transistor through said reactance circuit.

3. An active filter circuit according to claim 1, wherein an input signal is supplied to the base electrode of said fifth transistor.

4. An active filter circuit according to claim 1, wherein the base electrode of said sixth transistor is connected to said output terminal.

5. An active filter circuit according to claim 4, wherein an input signal is supplied to the base electrode of said fifth transistor, and said reactance circuit comprises a capacitor which is connected to said collector electrode.

6. An active filter circuit according to claim 4, wherein an input signal is supplied to said collector electrode of said second transistor through said reactance circuit which comprises a capacitor.

* * * * *